United States Patent
Cohen et al.

(10) Patent No.: US 6,853,093 B2
(45) Date of Patent: Feb. 8, 2005

(54) ANTI-TAMPERING ENCLOSURE FOR ELECTRONIC CIRCUITRY

(75) Inventors: Yitzhak Cohen, Yahud (IL); Arnon Aviv, Herzelia (IL)

(73) Assignee: Lipman Electronic Engineering Ltd., Rosh Haayin (IL)

( * ) Notice: Subject to any disclaimer, the term of this patent is extended or adjusted under 35 U.S.C. 154(b) by 98 days.

(21) Appl. No.: 10/326,726

(22) Filed: Dec. 20, 2002

(65) Prior Publication Data

US 2004/0120101 A1 Jun. 24, 2004

(51) Int. Cl.[7] .................. H01L 23/02; H01L 23/04; H01L 23/12
(52) U.S. Cl. ............... 257/992; 257/678; 257/679; 257/731; 257/698
(58) Field of Search ................ 257/992, 679, 257/678, 731, 698, 723

(56) References Cited

U.S. PATENT DOCUMENTS

| | | | | |
|---|---|---|---|---|
| 4,593,384 A | * | 6/1986 | Kleijne | ............... 365/228 |
| 4,807,284 A | * | 2/1989 | Kleijne | ............... 713/194 |
| 5,353,350 A | * | 10/1994 | Unsworth et al. | ........ 713/194 |
| 5,861,662 A | | 1/1999 | Candelore | |
| 5,877,547 A | | 3/1999 | Rhelimi | |
| 5,998,858 A | | 12/1999 | Little et al. | |
| 6,359,338 B1 | | 3/2002 | Takabayashi | |
| 6,414,884 B1 | | 7/2002 | DeFelice et al. | |
| 6,438,825 B1 | | 8/2002 | Kuhn | |

FOREIGN PATENT DOCUMENTS

| | | |
|---|---|---|
| EP | 03257680 | 8/1989 |
| EP | 0375545 | 6/1990 |

* cited by examiner

*Primary Examiner*—Nitin Parekh
(74) *Attorney, Agent, or Firm*—Townsend and Townsend and Crew LLP

(57) ABSTRACT

An electronic circuit assembly including a plurality of printed circuit boards including electrical circuits and electronic components mounted on at least one of the plurality of printed circuit boards in electrical communication with the electrical circuits, wherein at least some of the plurality of printed circuit boards define an anti-tamper enclosure for at least some of the electronic components.

15 Claims, 4 Drawing Sheets

ANTI-TAMPERING ENCLOSURE FOR ELECTRONIC CIRCUITRY

FIELD OF THE INVENTION

The present invention relates to protection of electronic circuitry generally and more particularly to automatic self destruct mechanisms that are actuated by tampering.

BACKGROUND OF THE INVENTION

The following U.S. Patents are believed to represent the current state of the art: U.S. Pat. Nos. 5,861,662; 5,998,858; 6,359,338 and 6,414,884 and the disclosure thereof is hereby incorporated by reference.

SUMMARY OF THE INVENTION

The present invention seeks to provide an improved anti-tampering enclosure for electronic circuitry.

There is thus provided in accordance with a preferred embodiment of the present invention an electronic circuit assembly including a plurality of printed circuit boards including, electrical circuits and electronic components mounted on at least one of the plurality of printed circuit boards in electrical communication with the electrical circuits, wherein at least some of the plurality of printed circuit boards define an anti-tamper enclosure for at least some of the electronic components.

Preferably, at least some of the plurality of printed circuit boards physically surround at least some of the electronic components.

In accordance with a preferred embodiment of the present invention, at least some of the plurality of printed circuit boards include conductor patterns which become short circuited or interrupted when tampered with.

Preferably, the electronic circuit assembly also includes detection circuitry, which senses short circuits or breaks in the conductor patterns and provides a tampering alarm output indication in response thereto and a self-destruct circuit, which provides a circuitry destroying electrical output to the electronic components which are surrounded by the plurality of printed circuit boards.

In accordance with a preferred embodiment of the present invention, the detection circuitry and the self-destruct circuit are surrounded by the plurality of printed circuit boards.

Preferably, the detection circuitry also senses separation of the plurality of printed circuit boards from each other.

In accordance with a preferred embodiment of the present invention, the electronic circuit assembly forms part of a personal identification number pad.

In accordance with another preferred embodiment of the present invention, the electronic circuit assembly forms part of a point of sale terminal.

BRIEF DESCRIPTION OF THE DRAWINGS

The present invention will be understood and appreciated more fully from the following detailed description, taken in conjunction with the drawings in which.

DETAILED DESCRIPTION OF A PREFERRED EMBODIMENT

Figure 1A:
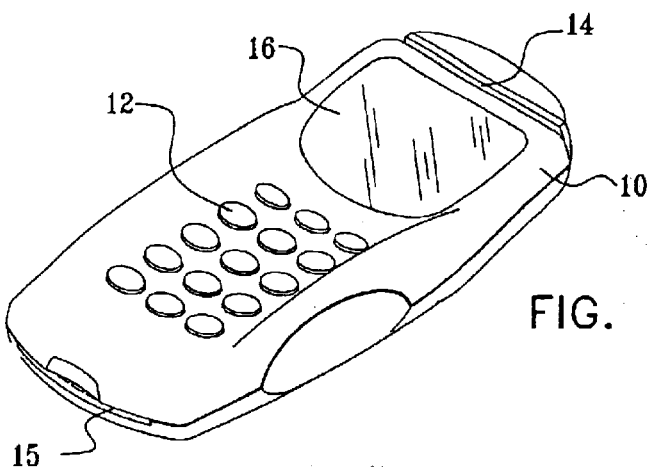
FIGS. 1A, 1B and 1C are, respectively, simplified pictorial, partially cut away pictorial and nearly fully cut away pictorial illustrations of a point-of-sale device including an anti-tamper enclosure constructed and operative in accordance with a preferred embodiment of the present invention.
Figure 1B:
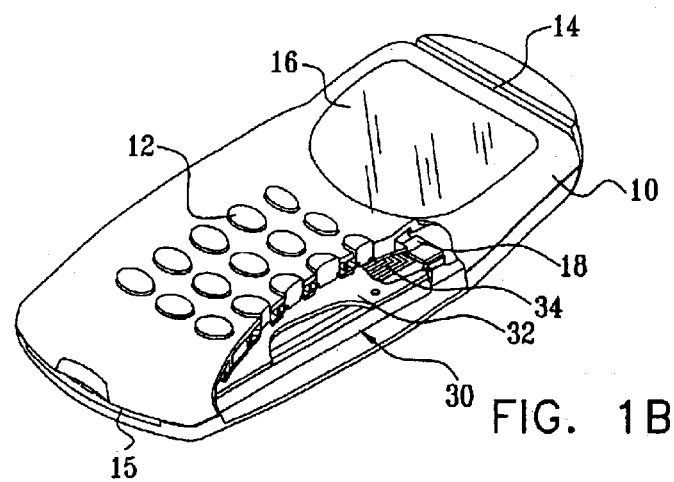
Figure 1C:
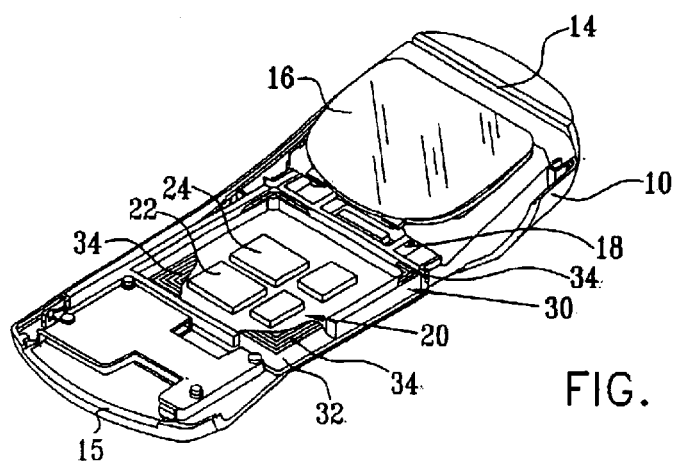

Reference is now made to FIGS. 1A, 1B and 1C, which are simplified pictorial illustrations of a point-of-sale device including an anti-tamper enclosure constructed and operative in accordance with a preferred embodiment of the present invention. The point of sale device may be any suitable point-of-sale device, such as a Nurit Model 8000 POS terminal or a Nurit Model 292 Personal Identification Number (PIN) pad, commercially available from Lipman Electronic Engineering Ltd. of Rosh Haayin, Israel.

As seen in FIGS. 1A–1C, the point-of-sale device typically includes, disposed within a housing 10, a keyboard 12, a magnetic card reader 14, a smart card reader 15, a display 16, a modem 18 and validation circuitry 20, which typically includes data critical components, such as microprocessors 22 and memories 24, which it is sought to protect against tampering. Such data critical components may include encryption keys and personal identification data.

In accordance with a preferred embodiment of the present invention there is provided an anti-tamper enclosure 30 which encloses at least the data critical components 22 and 24. In accordance with a preferred embodiment of the present invention, the anti-tamper enclosure 30 is formed of conventional multi-layer printed circuit boards 32 which include at least one layer of an electrical conductor pattern 34, which provides an output indication of tampering when shorted or disconnected.

Figure 2:
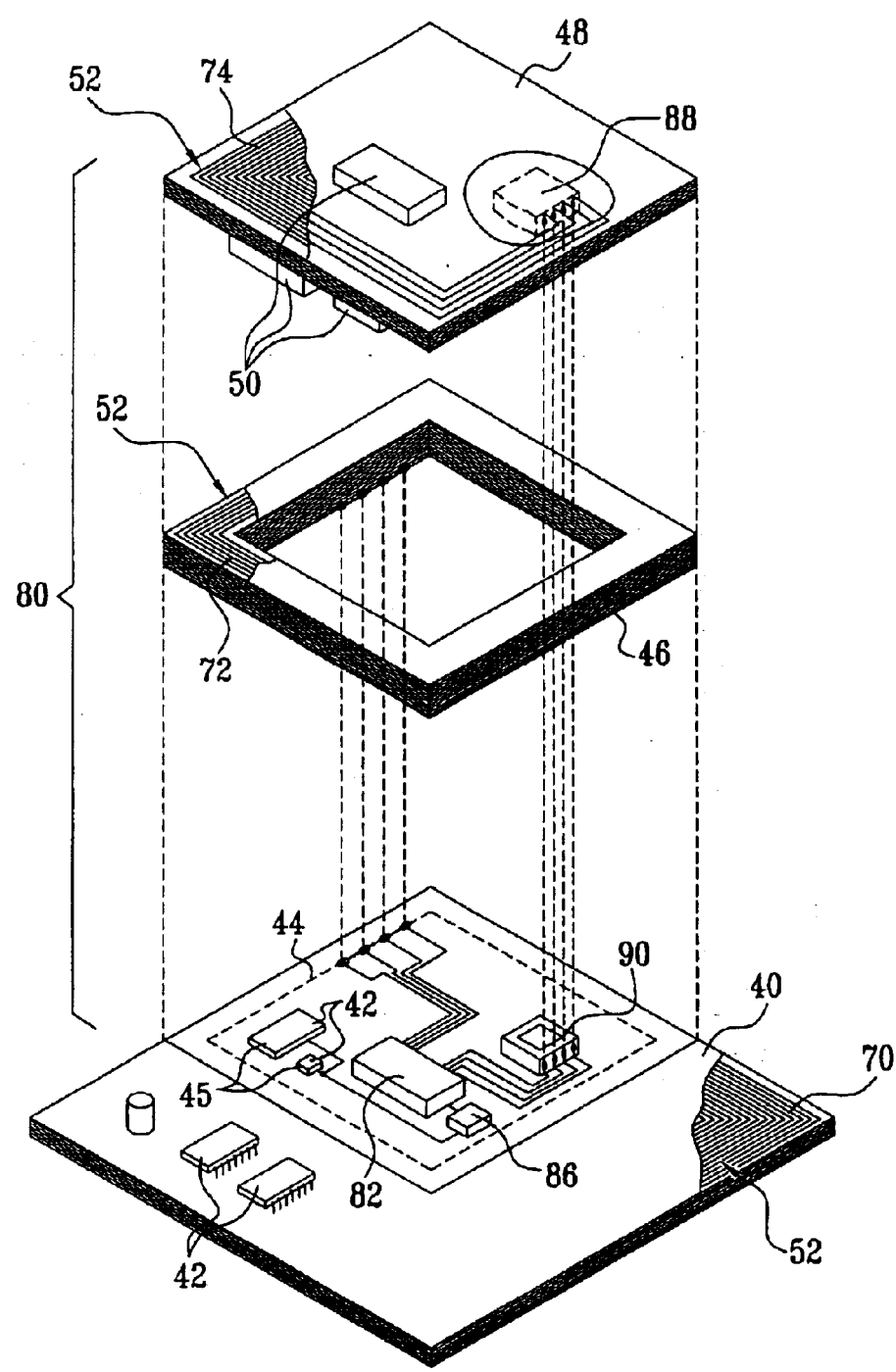
FIG. 2 is a simplified, exploded view schematic illustration of electronic circuitry located within an anti-tamper enclosure constructed and operative in accordance with a preferred embodiment of the present invention.

Reference is now made to FIG. 2, which is a simplified, exploded view schematic illustration of electronic circuitry located within an anti-tamper enclosure constructed and operative in accordance with a preferred embodiment of the present invention.

As seen in FIG. 2, the anti-tamper enclosure preferably comprises a base printed circuit board 40, which preferably includes conventional electronic circuitry and may include a ground plane and may have electronic components 42 mounted thereon both within and outside of a protected region, which is designated by reference numeral 44. Data critical components, such as microprocessors and memories, which it is sought to protect against tampering, here designated by reference numeral 45, are shown located within the protected region 44.

Protected region 44 is peripherally enclosed by one or more printed circuit boards 46 and is covered by a printed circuit board 48, which may also include conventional electronic circuitry and have electronic components 50 mounted thereon both within and outside of the protected region 44.

In accordance with a preferred embodiment of the present invention, the various printed circuit boards making up the protective enclosure are each provided with one or more layers of a electrical conductor pattern 52, which provides an output indication of tampering when shorted, with itself or other circuitry in the printed circuit board, or disconnected.

An anti-tamper conductor pattern 60 which is useful in the embodiments of FIGS. 1A–1C and FIG. 2 is shown in FIG.

3. It may be readily appreciated that the conductors in conductor pattern 60 are arranged such that any short or interruption produced by tampering therewith changes the electrical characteristics thereof. Preferably each such conductor pattern has a pair of connection terminals 62.

Figure 3:
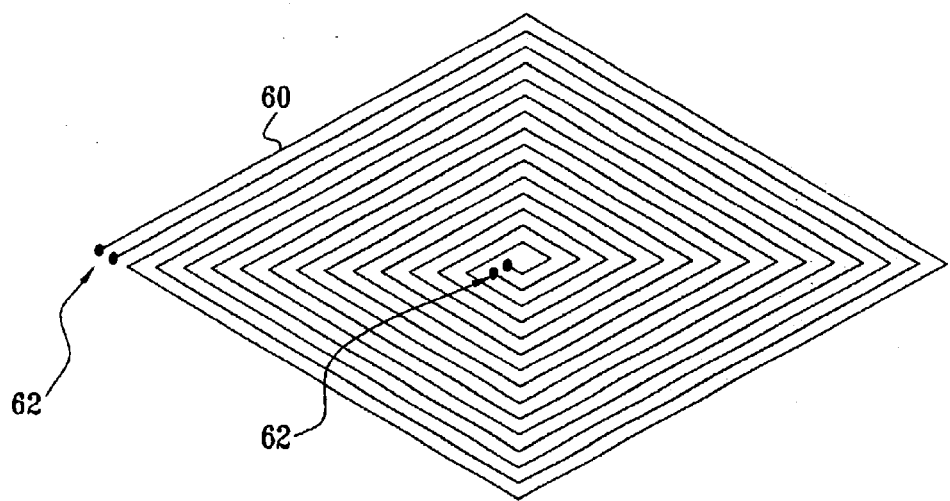
FIG. 3 is a simplified illustration of an anti-tamper conductor pattern which is useful in the embodiments of FIGS. 1A–1C and FIG. 2.
Figure 4:
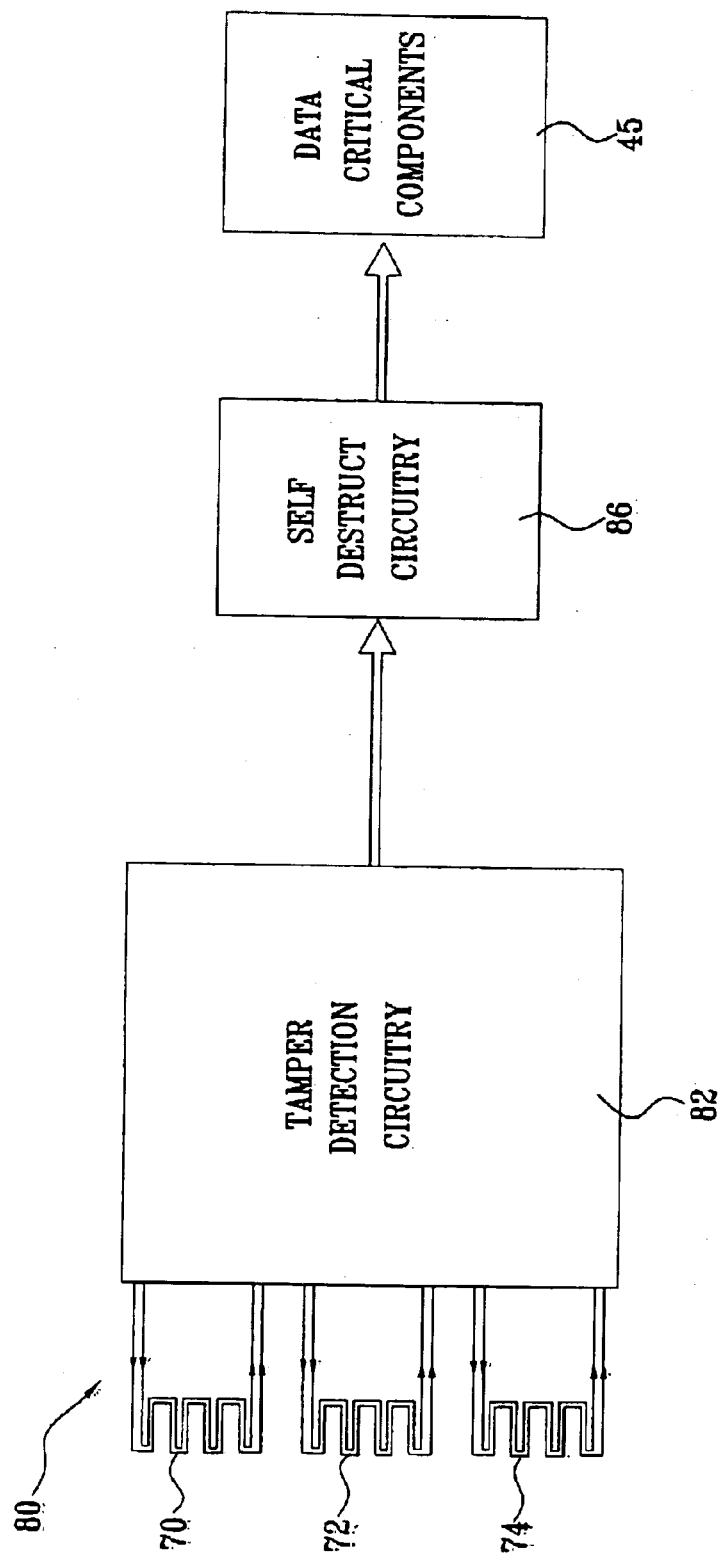
FIG. 4 is a simplified illustration of protective circuitry which is actuated by tampering detected by one or more anti-tamper conductor patterns of the type shown in FIG. 3.

Reference is now made additionally to FIG. 4, which is a simplified illustration of protective circuitry employed in the embodiment of FIG. 2, which is actuated by tampering detected by one or more anti-tamper conductor patterns of the type shown in FIG. 3.

As seen in FIG. 4, typically three conductor patterns, here designated 70, 72 and 74 and corresponding respectively to base, peripheral and cover printed circuit boards which define an anti-tamper enclosure 80, are connected, typically in parallel, to conventional, tamper detection circuitry 82, which senses short circuits or breaks in the conductor patterns and in the connections thereto and provides a tampering alarm output indication in response thereto. The output of detection circuitry 82 is preferably supplied as an input to a self-destruct circuit 86, which provides a circuitry destroying electrical output, such as a relatively high energy pulse, to data critical components 45 and possibly other electronic circuitry within anti-tamper enclosure 80. Examples of detection circuitry and of self-destruct circuitry appear, inter alia, in U.S. Pat. No. 5,998,858, the disclosure of which is hereby incorporated by reference.

Returning to FIG. 2, it is seen that preferably, the detection circuitry 82, and the self-destruct circuit 86 are located within the anti-tamper enclosure 80. It is also seen in FIG. 2 that preferably terminals of the conductor pattern 74 in printed circuit board 48 are coupled via a connector 88 on board 48, which is attached to a corresponding connector 90 on printed circuit board 40. Connector 90 connects the conductor or pattern 74 to detection circuitry 82.

Terminals of the conductor pattern 72 of printed circuit board 46 are typically hard wired to corresponding conductors on printed circuit board 40, which connect conductor pattern 72 to detection circuitry 82.

Terminals of conductor pattern 70 on base printed circuit board 40 are typically connected by conductors (not shown) directly to detection circuitry 82.

It is appreciated that the connections between the various conductor patterns and the detection circuitry 82 are such that any physical separation of the printed circuit boards from each other causes an interruption in the connection which is detected as tampering.

It will be appreciated by persons skilled in the art that the present invention is not limited to what has been particularly shown and described hereinabove. Rather the scope of the present invention includes both combinations and subcombinations of the various features described hereinabove as well as modifications and variations thereof as would occur to a person of skill in the art upon reading the foregoing specification and which are not in the prior art.

What is claimed is:

1. An electronic circuit assembly comprising:
    a plurality of printed circuit boards including electrical circuits, said plurality of printed circuit boards defining a protected enclosure including at least one protected enclosure wall defining printed circuit board and a protected enclosure surrounding edge defining printed circuit board; and
    electronic components, located within said protected enclosure, mounted on at least one of said plurality of printed circuit boards in electrical communication with said electrical circuits, said electronic components including at least an anti-tamper circuit and a destruct circuit operated by said anti-tamper circuit.

2. An electronic circuit assembly according to claim 1 and wherein said electronic circuit assembly forms part of a personal identification number pad.

3. An electronic circuit assembly according to claim 1 and wherein said electronic circuit assembly forms part of a point of sale terminal.

4. An electronic circuit assembly according to claim 1 and wherein said protected enclosure surrounding edge defining printed circuit board is arranged to be parallel to said at least one protected enclosure wall defining printed circuit board.

5. An electronic circuit assembly according to claim 4 and wherein said protected enclosure surrounding edge defining printed circuit board is formed with a central cut-out aperture defining said protected enclosure.

6. An electronic circuit assembly according to claim 5 and wherein said electrical circuits of said at least one protected enclosure wall defining printed circuit board and said protected enclosure surrounding edge defining printed circuit board are hard-wired to each other.

7. An electronic circuit assembly according to claim 5 and wherein said at least one protected enclosure wall defining printed circuit board comprises first and second protected enclosure wall defining printed circuit boards which are interconnected by an electrical connector.

8. An electronic circuit assembly according to claim 5 and wherein said electronic circuit assembly forms part of a personal identification number pad.

9. An electronic circuit assembly according to claim 5 and wherein said electronic circuit assembly forms part of a point of sale terminal.

10. An electronic circuit assembly according to claim 4 and wherein said electrical circuits of said at least one protected enclosure wall defining printed circuit board and said protected enclosure surrounding edge defining printed circuit board are hard-wired to each other.

11. An electronic circuit assembly according to claim 4 and wherein said at least one protected enclosure wall defining printed circuit board comprises first and second protected enclosure wall defining printed circuit boards which are interconnected by an electrical connector.

12. An electronic circuit assembly according to claim 4 and wherein said electronic circuit assembly forms part of a personal identification number pad.

13. An electronic circuit assembly according to claim 4 and wherein said electronic circuit assembly forms part of a point of sale terminal.

14. An electronic circuit assembly according to claim 1 and wherein said electrical circuits of said at least one protected enclosure wall defining printed circuit board and said protected enclosure surrounding edge defining printed circuit board are hard-wired to each other.

15. An electronic circuit assembly according to claim 1 and wherein said at least one protected enclosure wall defining printed circuit board comprises first and second protected enclosure wall defining printed circuit boards which are interconnected by an electrical connector.

* * * * *